(12) United States Patent
Hauf

(10) Patent No.: US 8,057,053 B2
(45) Date of Patent: Nov. 15, 2011

(54) DEVICE FOR CONTROLLING TEMPERATURE OF AN OPTICAL ELEMENT

(75) Inventor: Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/755,193

(22) Filed: Apr. 6, 2010

(65) Prior Publication Data

US 2010/0200777 A1    Aug. 12, 2010

Related U.S. Application Data

(63) Continuation of application No. PCT/EP2008/008428, filed on Oct. 7, 2008.

(60) Provisional application No. 60/978,565, filed on Oct. 9, 2007.

(51) Int. Cl.
*G02B 5/08* (2006.01)

(52) U.S. Cl. .................................................. 359/845

(58) Field of Classification Search .................. 359/845, 359/838

See application file for complete search history.

(56) References Cited

U.S. PATENT DOCUMENTS

| 3,590,228 | A | 6/1971 | Burke |
| 2004/0035570 | A1 | 2/2004 | Hara |
| 2004/0051984 | A1 | 3/2004 | Oshino et al. |
| 2005/0151954 | A1 | 7/2005 | Bartray et al. |
| 2006/0151724 | A1* | 7/2006 | Honda et al. ............... 250/504 R |

FOREIGN PATENT DOCUMENTS

| EP | 1 376 185 | 1/2004 |
| EP | 1 477 853 | 11/2004 |
| EP | 1 921 505 | 5/2008 |
| JP | 2004-039851 | 2/2004 |

OTHER PUBLICATIONS

International Search Report and Written Opinion for corresponding PCT Application No. PCT/EP2008/008428, dated Oct. 11, 2010.

* cited by examiner

*Primary Examiner* — Euncha Cherry
(74) *Attorney, Agent, or Firm* — Fish & Richardson P.C.

(57) ABSTRACT

A device serves for controlling temperature of an optical element provided in vacuum atmosphere. The device has a cooling apparatus having a radiational cooling part, arranged apart from the optical element, for cooling the optical element by radiation heat transfer. A controller serves for controlling temperature of the radiational cooling part. Further, the device comprises a heating part for heating the optical element. The heating part is connected to the controller for controlling the temperature of the heating part. The resulting device for controlling temperature in particular can be used with an optical element in a EUV microlithography tool leading to a stable performance of its optics.

20 Claims, 9 Drawing Sheets

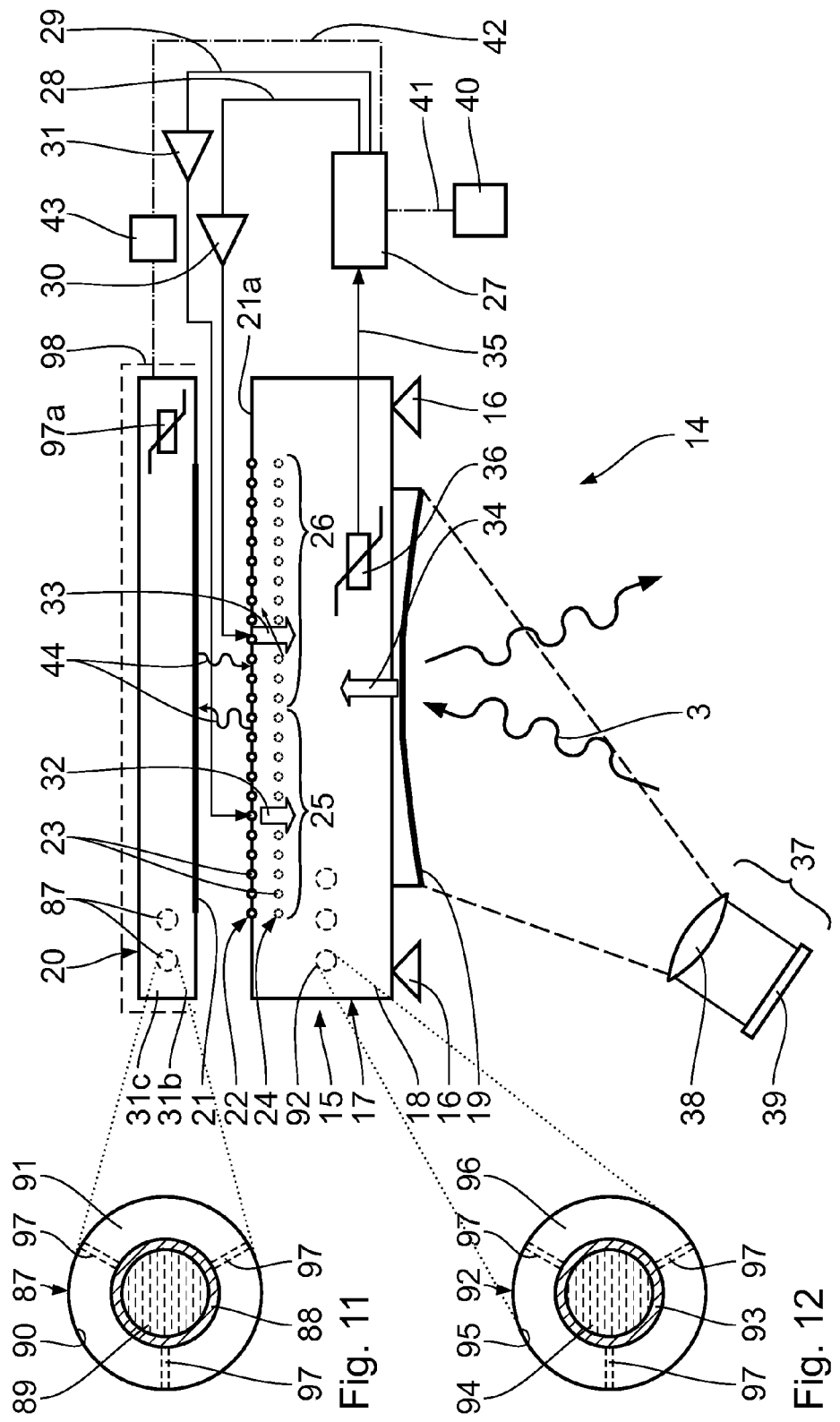

DEVICE FOR CONTROLLING TEMPERATURE OF AN OPTICAL ELEMENT

CROSS-REFERENCE TO RELATED APPLICATIONS

This application is a continuation of, and claims benefit under 35 USC 120 to, international application PCT/EP2008/008428, filed Oct. 7, 2008, which claims benefit of U.S. Ser. No. 60/978,565, filed Oct. 9, 2007. International application PCT/EP2008/008428 is hereby incorporated by reference in its entirety.

FIELD

The disclosure relates to a device for controlling temperature of an optical element provided in a vacuum atmosphere. The disclosure also relates to a method for controlling temperature of an optical element located in a vacuum atmosphere using such a device, an illumination system having such a device for controlling temperature, and a microlithography projection optics having such a device for controlling temperature.

BACKGROUND

In certain applications, it is very desirable to maintain the temperature or the temperature profile of an optical mirror device on a given and in particular on a constant level. Examples for such applications are in particular EUV (Extreme Ultra Violet) illumination and projection optics operating with illumination light wavelengths, in particular in the range between 10 nm and 30 nm. These optics generally have to operate in ultra high vacuum environment since the EUV photons are absorbed by atmospheric gases. Reflective and diffractive elements are generally the only possible optical elements to form and to guide EUV radiation since there is no transparent material available for this wavelength. Since it is very difficult to produce reflective coatings for mirror elements having a reflectivity close to 1 as a rule a portion of light hitting a mirror surface will be absorbed by the optical coating and/or the mirror substrate underneath. This absorbed radiant power in turn heats up the mirror substrates and, due to thermal expansion, changes the surface figure and consequently the optical properties of the mirror which is undesirable. In particular regarding EUV wavelengths this residual absorption leads to absorbed radiant powers which are not at all negligible. Temperature stabilization for high-quality optical mirrors faces several drawbacks since the surface figures of high quality optical mirrors are sensitive to parasitic forces and thus the mirror holding and suspension design has to be optimized for minimum parasitic forces and torques. Minimizing stiffness for appropriate force and torque directions often goes along with reducing cross-sections available for heat conduction. Therefore, a good holding structure in terms of minimum parasitic forces always is a bad thermal conductor raising thermal load problems on the mirror. Since in particular in EUV illumination systems the mirrors are held under vacuum, no gases can be used for mirror cooling purposes. Water cooling of a mirror substrate is problematic since water flowing through channels and tubes always gives rise to dynamic excitation of structural eigen-modes and therefore gives undesired vibrations. Ultra low expansion ceramics as the materials Zerodur made by Schott or ULE made by Corning which tolerate temperature changes to a certain amount are expensive and not easy to manufacture.

US 2004/0035570 A1 and US 2004/0051984 A1 show a mirror cooling method involving on radiation heat transfer. These mirror cooling systems involve on a controlled cooling of a heat sink. A rising thermal load on the mirror can be compensated by lowering the temperature of a cold surface of the heat sink.

SUMMARY

The disclosure provides a device for controlling temperature of an optical element provided in a vacuum atmosphere which in particular can be used for controlling temperature of an optical element, e.g. a mirror, in a EUV microlithography tool leading to a stable performance of the optical element. The device for controlling temperature can includes two controllable thermalization parts. On the one hand, there is a radiational cooling part, which may be realized as a heat sink which surface has a controllable temperature being lower than that of the optical element. On the other hand, there is a heating part for direct or indirect heating of the optical element. The heating part may be a heating mechanism including contact heating e.g. via a heating fluid or as a non-contact heating mechanism relying e.g. on radiation heat transfer, e.g. transfer of infrared radiation. Via controllable heating on the one hand and controllable heat transfer to the radiational cooling part on the other, a very flexible approach is realized regarding control of a given temperature profile of the optical element. Undesired changes of surface figures caused by thermal expansion due to residual absorption of illumination light can be eliminated for example in a first part of the optical mirror via additional heating with the help of the heating part, in a second part of the optical element via selectively controlled radiation transfer to the radiational cooling part, and in a third part of the optical element via a combination of heating on the one hand and selective radiation transfer to the cooling part on the other. This combined and flexible approach leads to the possibility to obtain for example a homogeneous temperature profile within the optical element or helps to obtain a temperature profile with a given symmetry helping to reduce respective wave-front errors. Compared to non-radiational cooling parts, relying e.g. on contact cooling of the optical element itself via the flow of a cooling medium, the radiational cooling part according to the present disclosure avoids a vibrational disturbance of the optical element.

The disclosure provides a temperature stabilization that can help to prevent thermal drift effects.

The disclosure provides a controller that can equalize changes which normally would occur as a result of a change of the amount of working radiation impinging on the mirror. Such an illumination change for example may be introduced by changing an illumination setting of an illumination system, the optical element being part of this illumination system.

The disclosure provides a temperature sensor that can give a good control over the temperature of the optical element. The temperature sensor may be located in the vicinity of an absorbing or reflecting surface of the optical element. In that case, the temperature is measured at the relevant location and therefore gives a direct measure. The temperature sensor may be designed as a non-contact temperature sensor. This avoids disturbance of the structural integrity of the optical element. Regarding a non-contact design of the temperature sensor, this sensor may include a thermal imaging system.

The disclosure provides a cooling arrangement that can lead to an efficient cooling of the radiational cooling part.

The same holds for the heating arrangement disclosed herein.

The disclosure provides a radiational shielding that can avoid an undesired disturbance of the radiational cooling part via members other than the optical element. This leads to a good control of a surface temperature of the radiational cooling part irrespective of an arrangement of members other than the optical element, the temperature of which is to be controlled via the device.

The disclosure provides a radiational shielding that can avoid a disturbance of neighboring components, e.g. neighboring optical components or neighboring holding structures.

The disclosure provides a Peltier element that can lead to an efficient cooling of the radiational cooling part.

The disclosure provides a heat-receiving plate that can lead to a radiational cooling part having well-adjustable thermalization properties. Adjustment of these thermalization properties can be done via the material properties, in particular the thermal conductivity, of the materials constituting the heat-receiving plate on the one hand and the cooling member on the other. In addition, adjustment of the thermalization properties is possible via the thickness of the heat-receiving plate or the cooling member or via the shape of these components which may for example be complementary to that of the optical element.

The disclosure provides a cooling part that can avoid a vibrational disturbance of the cooling part due to vibrations induced by the flow of the cooling fluid through the conduit. Due to the gap, the conduit is vibrationally decoupled from the body of the cooling part. Thus, also a disturbance of the optical element is avoided.

The disclosure provides a radiational cooling part that can enable a selective heat transfer from the optical element to the radiational cooling part. This gives a radiational heat transfer profile across a surface of the optical element facing the radiational cooling part. Such a profile may be matched to an illumination intensity profile or may be matched to a heating profile, respectively, for illuminating illumination induced wave-front aberrations.

The advantages of a heating part disclosed herein can correspond to that of the cooling part disclosed herein. In some cases, the mirror body in case of the device disclosed herein is not disturbed via vibrations induced by the heating fluid flowing through the conduit.

The disclosure provides a surface arrangement of the cooling part that can efficiently cools the reflecting surface via radiational heat transfer.

The disclosure provides a spacer that can stabilize the run of the fluid conduit within the channel. The spacer can include a spring member and/or a damping member to eliminate transfer of conduit vibrations to the inner wall.

The advantages of a method for controlling temperature of an optical element disclosed herein are those already discussed with respect to the device itself.

The same holds for an illumination system disclosed herein and for a microlithography projection optics disclosed herein.

The disclosure relates further to a device for controlling temperature of an optical mirror device having an optical mirror having a reflecting surface. Further, the disclosure relates to a method for controlling temperature of such an optical mirror device, a microlithography illumination optics having such a device for controlling temperature, an illumination system having such a microlithography illumination optics, a microlithography projection optics having such a device for controlling temperature, a microlithography tool having at least one mirror device being equipped with such a device for controlling temperature and a method for production of a microstructured component using such a microlithography tool. Further, the disclosure relates to a system having a temperature stabilized element.

The disclosure provides a device for controlling temperature of an optical mirror device having an optical mirror having a reflecting surface which in particular can be used for controlling temperature of a mirror device in a EUV microlithography tool leading to a stable performance of the optical mirror irrespective of the heat load on the mirror due to residual absorption of reflected light.

A device for controlling temperature of an optical element, in particular of an optical mirror device having an optical mirror having a reflective surface, can include
  at least one heat sink to receive thermal radiation from a mirror heat transfer area of the optical mirror,
  a heating device to heat the mirror heat transfer area,
  a control device
    being in signal connection with the heating device and
    controlling the heating device such that in steady state a total mirror heat load on the optical mirror resulting from
      heat received from the heating device,
      heat received from an illuminating light source whose illuminating light impinges on the mirror which mirror is designed to guide the usable illumination light of the illumination light source,
    is maintained constant.

The inventors found something that is somewhat paradox: They realized that the aforementioned problems can be solved by adding additional heat to the system. With the additional heating device a steady state of temperature profiles can be achieved which is practically no more disturbed by the heat arising from residual absorption of reflected light. If such residual absorption occurs, the heating power of the heating device is lowered in a controlled manner such that the total heat load remains constant. Thus, if any, only small changes of the total thermal behavior of the system which uses the optical mirror device having the device for controlling temperature according to the present disclosure occur. The absolute temperature of the mirror device remains more or less constant. Unwanted thermal expansion leading to disturbances of the optical performance of the mirror device do not occur. Since heating can take place with low response time, the thermal stabilization is done with low time constant and so controlling temperature within a small temperature range is possible. For instance, a given mirror substrate material having a coefficient of thermal expansion of $10^{-6}$ 1/K and a given thermal expansion limit on the optical surface of 0.2 nm, a temperature control leading in steady state to a temperature profile which is maintained constant on a scale of 0.02 K is to be realized. In general, using temperature stabilization according to the disclosure, temperature profiles can be achieved being constant in time on a scale of 0.1 K or even on a scale of 0.01 K or better. The disclosure is not limited to EUV applications since residual absorptions in reflecting mirrors occur practically at all wavelengths and therefore, in demanding applications, temperature profile of such mirrors also has to be kept constant. The mirror heat transfer area may be a part of the optical mirror. This leads to a direct impact of the heating device on the reflecting surface and therefore gives a direct control of the mirror temperature. The mirror heat transfer area may be a substrate of the mirror. A diffractive element used in a reflection mode also is an example of an optical mirror whose temperature can be controlled via the device according to the disclosure. In practice, the optical mirror device may be a structured reflecting component, e.g. a reticle used in lithographic projection exposure to produce integrated microelectronic circuits.

A heat sink that is not in mechanical contact with the mirror heat transfer area ensures that no mechanical stress is introduced to the mirror surface via the heat sink.

A temperature sensor to measure the temperature of the mirror heat transfer area and in signal connection with the control device gives a good control over the mirror temperature to be kept constant in steady state. The at least one temperature sensor may be located in the vicinity of the reflecting surface of the optical mirror. In that case, the temperature is measured at the relevant location and therefore gives a direct measure. The temperature sensor may be designed as a non-contact temperature sensor. This avoids disturbance of the structural integrity of the optical mirror device. Regarding a non-contact design of the temperature sensor, this sensor may include a thermal imaging system. Such a thermal imaging system gives the possibility of a direct thermal measurement of the reflecting surface permitting optimum control of its temperature.

By having a control device which is in signal connection or is part of a control device of an illumination system including the illumination light source control is possible even without a temperature sensor, only by checking the status of the illumination device. The control device may be in signal connection with a cooling device of the heat sink of the device. Such a control device in particular care for a constant temperature of the heat sink. When the optical mirror device whose temperature is maintained with the device according to the disclosure is used in an optical system having different operating modes, each of these modes can have a different temperature of the heat sink which can be chosen via the control device. Examples for such different operating modes are different illumination settings.

A heat sink structured such that thermal radiation transfer from the heat transfer area to the heat sink varies with respect to different parts of the reflecting surface gives the possibility of adapting the heat transfer to the geometry of the heat load due to the residual absorption of the reflected light. The heat sink may be arranged such that portions of the optical mirror having a higher amount of residual absorption also have a higher heat transfer to the heat sink. The heat sink may include at least two sections having different distances to the reflecting surface. Such a heat sink is a design example for a heat sink with varying heat transfer. The heat sink may include at least two heat sink fingers pointing towards to the reflecting surface. Such heat sink fingers can be adapted to a desired heat transfer geometry. The heat sink may have multiple heat sink fingers arranged in a hexagonal field structure. Such a heat sink structure can be adapted to complex heat transfer patterns. The length of the at least two heat sink fingers of a heat sink having a respective design may be equal. Such heat sink fingers are easy to manufacture. Alternatively, the heat sink fingers may have different lengths. Such heat sink fingers provide the possibility to manufacture a heat sink with varying heat transfer or the possibility to manufacture a heat sink following the curvature of a bended reflecting surface. The length of the heat sink fingers follows the curvature of the reflecting surface. Such a heat sink gives, taking into account the heat sink fingers, a uniform heat transfer even over a curved reflecting surface.

A heating device structured such that the heat transfer from the heat transfer area to the reflective surface varies with respect to different parts of the reflective surface gives the possibility to adapt the heating by the heating device to the heating by residual absorption to give for example a constant heating over the whole reflecting surface. In particular, the heating device is structured to give the possibility of a heating pattern which is complementary to the heating pattern by residual absorption.

A heating device including at least two heating zones which are controllable individually via the control device gives the possibility to produce different heating patterns and therefore to adapt two different illumination patterns of the optical mirror. This in particular is advantageous in case of an illumination system for a microlithography tool having different illumination settings.

Heating zones arranged to give a heat receiving distribution of the reflective surface of annular, quadrupole or dipole symmetry can be adapted according to respective illumination settings of an illumination device giving a respective illumination pattern on the mirror device.

Resistance wires are an inexpensive way to produce a heating device.

An arrangement of the resistance wires according to which the resistance wires are embedded in a substrate of the optical mirror leads to an efficient heat transfer into the optical mirror device.

An arrangement of the resistance wires according to which the resistance wires are embedded directly underneath an optical coating of the reflecting surface gives a direct heat transfer to the reflecting surface.

The heat sink may include at least two heat sink fingers pointing towards the reflecting surface.

Recesses receiving the heat sink fingers result in a good heat transfer between the substrate and the heat sink fingers.

The disclosure is not limited to cases where the heat transfer area is part of the optical mirror itself. The heat transfer area may be a heat receiving structure neighboring the optical mirror. In that case, in steady state a constant temperature profile is maintained at the heat receiving structure.

A mirror holding structure may serve as the heat receiving structure. In that case, a thermal equilibrium is maintained at the mirror holding structure which in most cases is sufficient to stabilize the optical properties of an illumination optics including optical mirrors held with the help of this structure. This relaxes the desired properties for the coefficient of thermal expansion of the structure material while controlling the dimensional stability of the structure. For example, metals could be used while providing a device for controlling temperature according to the disclosure instead of low-expansion ceramics which is beneficial in terms of material and machine costs, joining technology and handling. Further, the thermal conductivity of metals is in general much better than the thermal conductivity of ceramics with low coefficient of thermal expansion which helps to keep the temperature distribution of the optical mirrors uniform under non-uniform thermal loads.

The advantages of the method for controlling temperature of an optical mirror device having an optical mirror having a reflecting surface including the steps of heating the mirror device via a heating device, controlling the mirror device heating such that in steady state a total mirror device heat load resulting from heat received from the heating device on the one hand and heat received from an illumination light source whose illumination light impinges on the mirror on the other which mirror is designated to guide the usable illumination light of the illumination light source is maintained constant, are those already discussed with respect to the device itself. The mirror device heating may be controlled via measuring the temperature of the optical mirror. The mirror device heating may be controlled via measuring the temperature of a mirror holding structure. The mirror device heating may be controlled via checking the status of an illumination light source.

The same advantages hold for an illumination system having an illumination light source and a microlithography illumination optics having a plurality of optical mirrors, at least one of which being equipped with a device for controlling temperature according to the disclosure, and for a microlithography projection optics having a plurality of optical mirrors, at least one of which being equipped with a device for controlling temperature according to the disclosure. The illumination light source may be an EUV-source, emitting light in particular in a wavelength region between 5 nm and 30 nm.

The advantages of a system having
a cooling device,
a cooled surface of a cooling element being cooled by the cooling device to establish a first thermal radiation body,
a heating device being connected to the temperature stabilized element to establish a heated surface of a second thermal radiation body,
a control unit being in signal connection with the cooling device and the temperature stabilized element,
wherein the temperature stabilized element is part of a EUV projection exposure apparatus,
having a projection light bundle having a wavelength between 5 nm and 100 nm for imaging at least one object into at least one image,
wherein at least a part of the cooled surface is distant from a surface area of the temperature stabilized element,
wherein a temperature gradient directed towards the surface area of the temperature stabilized element is temporally adjustable via the control unit in absolute value and in direction, and
wherein in particular the temperature stabilized element is an optical element for guiding the light bundle or is part of the holding structure of the projection exposure apparatus
correspond to that already discussed with respect to the device. Adjustment of the temperature gradient in absolute value and in direction leads to the possibility to guide controlled temperature transients through the temperature stabilized element. This opens the door for sophisticated control schemes including feedforward-control and model-base-control.

BRIEF DESCRIPTION OF THE DRAWINGS

Exemplified embodiments of the disclosure now are described with the help of the accompanying drawings.

FIG. 10 shows in a manner similar to FIG. 2 an optical mirror device having a further embodiment of a device for controlling temperature;

FIG. 11 in an enlarged scale a cross-section of one cooling channel arranged in a heat sink of the device for controlling temperature of FIG. 10;

FIG. 12 in an enlarged scale a cross-section of one heating channel arranged in a mirror substrate of the device for controlling temperature of FIG. 10.

FIG. 1 shows schematically the general components of a microlithography tool 1 which is used for the production of microstructured components such as semiconductor microchips.

DETAILED DESCRIPTION

Figure 1:
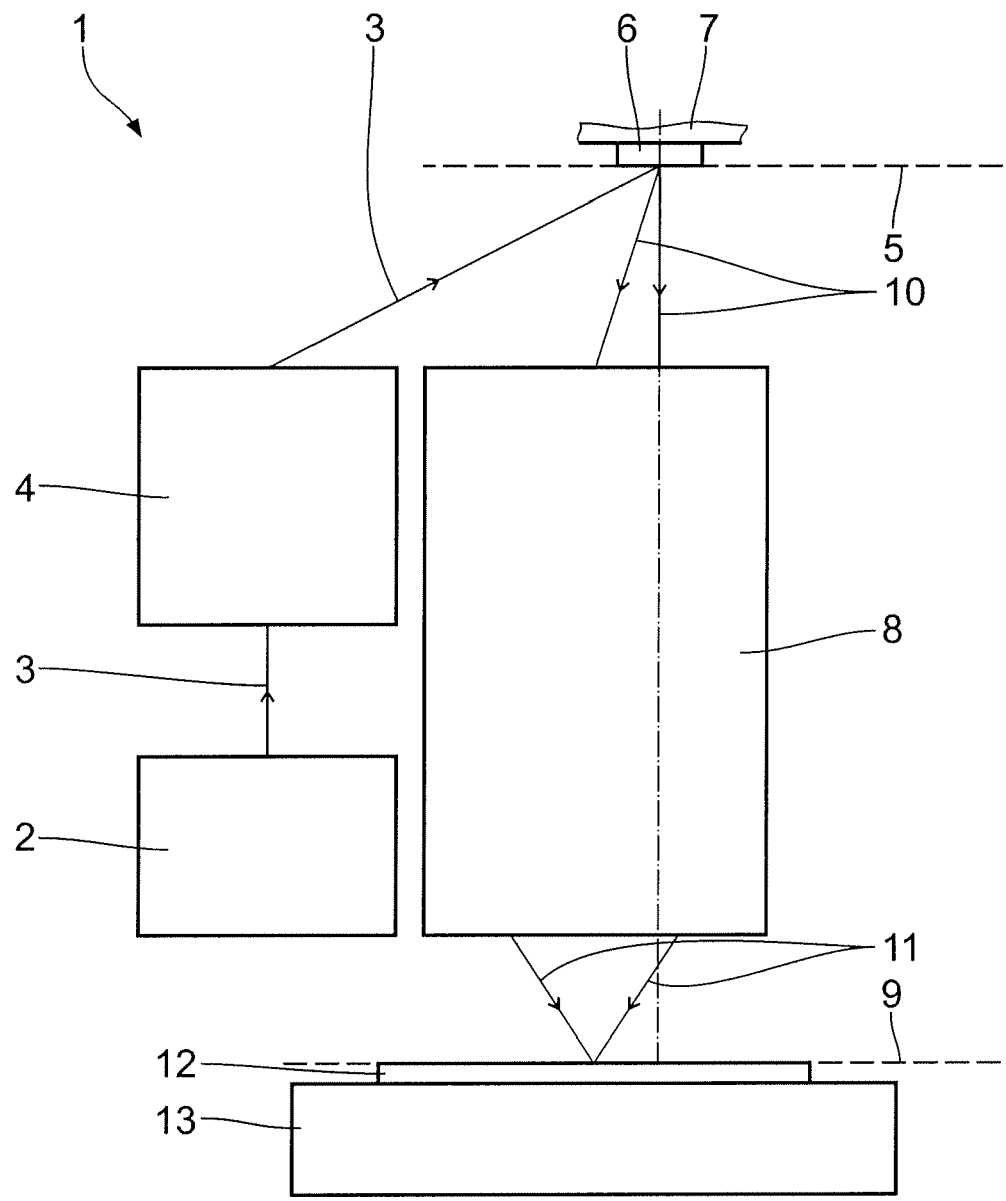
FIG. 1 shows schematically an overview of a microlithography tool.

The microlithography tool 1 has an illumination light source 2 emitting a bundle 3 of illumination light. In FIG. 1, only a chief ray of the illumination light bundle 3 is depicted. The illumination light source 2 is for example an extreme ultraviolet (EUV) light source emitting radiation having a wavelength between 5 nm and 30 nm. Advantageously, the illumination light source 2 is a plasma EUV light source.

After being emitted from the illumination light source 2, the illumination light bundle 3 is formed and guided by the help of an illumination optics 4. The illumination light source 2 and the illumination optics 4 are part of an illumination system of the microlithography tool 1. The illumination optics 4 includes several optical mirrors which are not shown in FIG. 1. The illumination optics 4 serves for the provision of a specific illumination of an object field lying in an object plane 5. The specific illumination is also known as illumination setting, meaning that the light bundle 3 has a specific predetermined intensity distribution, a specific predetermined angular distribution and, such as, a specific predetermined polarization distribution in the object plane 5. A reticle 6 which is held by a reticle stage 7 is arranged such that a master surface of the reticle 6 lies in the object field. The reticle 6 is a reflecting reticle.

A projection optics 8 images the illuminated object field in the object plane 5 into an image field in an image plane 9. To this end, the projection optics 8 receives an illumination light bundle 10 reflected from the reticle 6 and directs an illumination light bundle 11, formed from the incoming illumination light bundle 10 within the projection optics 8 to the image field. The projection optics 8 also includes several optical mirrors being reflective for the illumination light. These mirrors also are not shown in FIG. 1.

A surface of a wafer 12 is arranged in the image field. The wafer 12 is held by a wafer stage 13. The microlithography tool 1 may be operated as a stepper or as a scanner system. Both system types are well-known to the expert.

Figure 2:
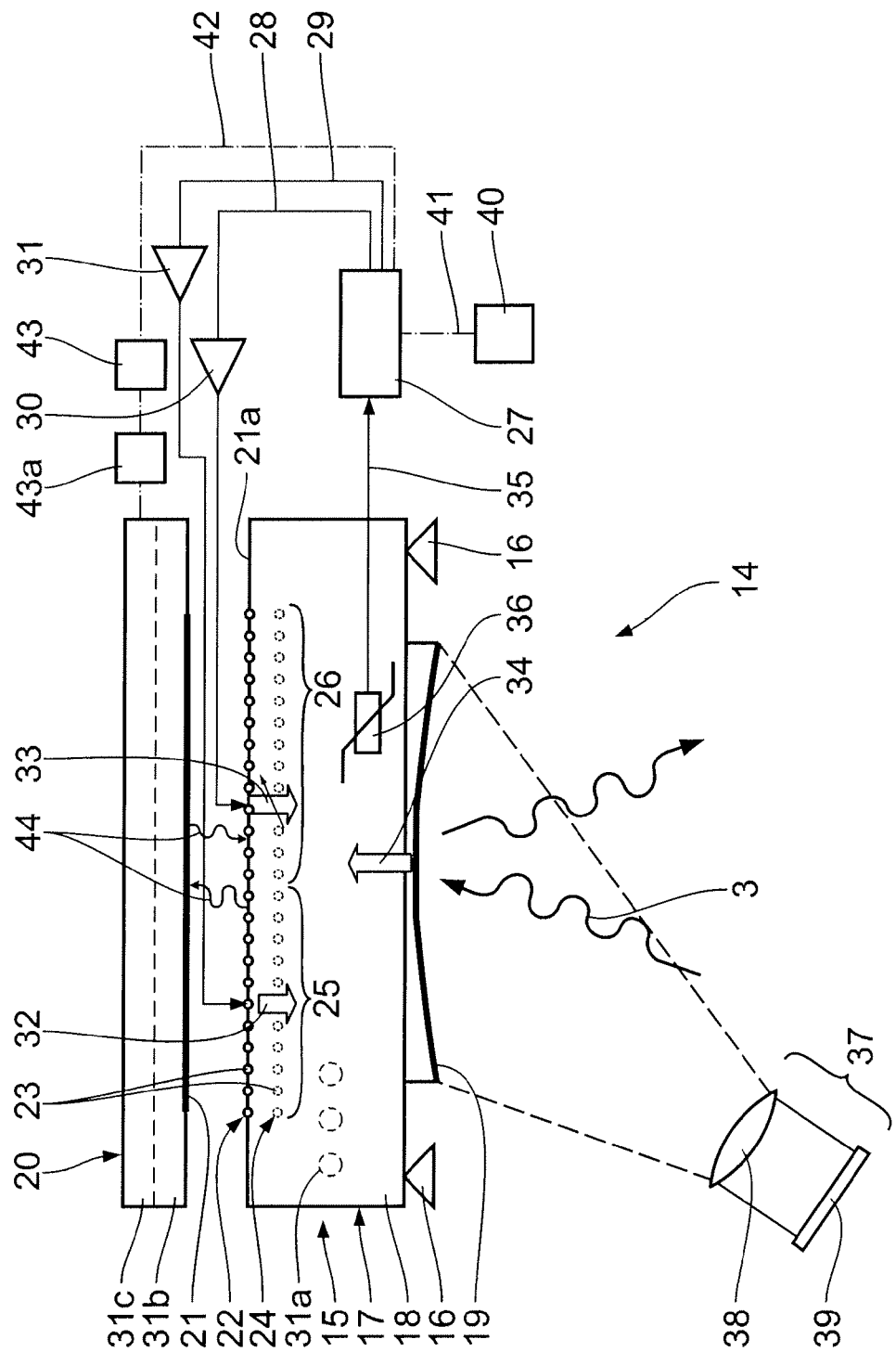
FIG. 2 shows schematically an optical mirror device of an illumination optics of an illumination system of the microlithography tool of FIG. 1 together with a device for controlling temperature of the optical mirror device having a heat sink.

FIG. 2 shows a device 14 for controlling temperature of an optical mirror device 15. The mirror device 15 as shown in FIG. 2 can be part of the projection optics 8, can be part of the illumination light source 2, e.g. a collector thereof, or can be part of the illumination optics 4 of the microlithographic tool 1. The optical mirror device 15 includes a mirror holding structure, holding points 16 of which are indicated in FIG. 2 as triangles. The holding structure may include flexible supports corresponding to those described e.g. with respect to FIGS. 19 and 22 in US 2004/0051984 A1. Further, the optical mirror device 15 includes an optical mirror 17 having a mirror substrate or body 18 carrying a reflecting surface 19 being designed as an optical surface with a reflective coating. The optical mirror 17 and all the other components of the illumination optics 4 and the projection optics 8 guiding the illumination light bundle 3 are provided in a vacuum atmosphere.

The device 14 may include a diffractive optical element which thereafter also is referred to as the optical mirror 17. Such a diffractive optical element is able to diffract light from the illumination light bundle 3. The optical mirror 17 is shown as a concave mirror. The reflecting surface 19 serves to reflect light from the illumination light bundle 3 which is depicted schematically in FIG. 2. Depending on the illumination setting, more or less the whole reflecting surface 19 may be illuminated by light from the illumination light bundle 3. Alternatively, only parts of the reflecting surface 19 can be illuminated by light from the illumination light bundle 3, depending on the position of the mirror device 14 within the lithography tool 1, e.g. in or near a pupil plane or a field plane of the optics 4, 8 and depending on the illumination setting.

Part of the temperature controlling device 14 is at least one heat sink 20, one of which is shown in FIG. 2. The heat sink 20 serves as a radiational cooling part of the temperature controlling device 14. The heat sink 20 includes a heat-receiving plate. The heat sink 20 includes a cold surface 21 facing the mirror substrate 18 opposite of the reflecting surface 19. The temperature of the cold surface 21 is maintained via adequate an control mechanism on a constant temperature level which in all cases is below the temperature of the mirror substrate 18. In operation, the heat sink 20, i.e. the cold surface 21, receives thermal radiation from the mirror substrate 18 which in the embodiment of FIG. 2 serves as a mirror heat transfer area of the optical mirror 17. The temperature of the cold surface 21 may be maintained on a predetermined temperature profile. This temperature profile is given by the temperature distribution of the cold surface 21 in space and time coordinates. This temperature profile may be controlled regarding these coordinates. In general, the cold surface 21 may have an arbitrary spatial shape. The heat sink 20 is not in mechanical contact with the mirror substrate 18 to reduce mechanical stress on the mirror substrate 18 caused due to the presence of the heat sink 20. The heat sink 20 in addition may be arranged at the periphery of the optical mirror 17, i.e. facing the side surfaces of the mirror substrate 18. The heat sink 20 is made of a metal or of a ceramic material. The cold surface 21 may be processed to increase a heat absorption efficiency of the surface compared to an otherwise similar non-processed surface. The cold surface 21 may provide a ceramic, oxide-, carbide- or nitrite-containing coating on the surface. The cold surface 21 for example may be processed to provide an increased surficial roughness or surficial irregularity resulting in an increased heat-absorption area of the surface. The cold surface 21 may include spatially distributed structures to provide an increased heat-absorption efficiency from the rear surface 21a of the mirror body 18.

Heating device 22 are also part of the temperature controlling device 14. In the embodiment of FIG. 2, the heating device 22 are designed as surface heating device heating a rear surface 21a of the mirror substrate 18, i.e. the mirror backside, facing towards the cold surface 21 of the heat sink 20. The surface 21a may be processed or may provide a coating or may include spatially distributed structures as described above with reference to the cold surface 21 of the heat sink 20. The heating device 22 includes resistance wires 23 which in FIG. 2 are shown in cross-section. The resistance wires 23 are arranged at the surface 21a. Alternatively, as indicated in FIG. 2, heating device 24 may be provided as resistance wires being embedded in the mirror substrate 18. The resistance wires 23 may be electrically connected as one single electrical circuit, e.g. forming a parallel or serial connection controlled by at least one control circuit regarding their electrical power. Alternatively, as indicated in FIG. 2, the resistance wires 23 are connected electrically as being part of different electrical circuits controlled by different controllers regarding their electrical power. FIG. 2 shows two groups 25, 26 of resistance wires 23 belonging to different electrical circuits. These groups 25, 26 define two heating zones which are controllable individually via a controller 27. Via lines 28, 29 and power amplifiers 30, 31, the controller 27 is connected to the groups 25, 26 of the resistance wires 23.

Instead of or in addition to the groups 25, 26 of the resistance wires 23, heating zones may be defined by fluid channels 31a for heating fluid. Examples of these fluid channels 31a are shown as dashed lines in cross-section in FIG. 2. These fluid channels 31a are arranged within the mirror substrate 18 at a given distance to the reflecting surface 19. In a plane being parallel to the rear surface 21a of the mirror substrate 18, the heating fluid channels 31a are equally distributed. Typical arrangements of fluid channels are disclosed in US 2004/0035570 A1. The flow of heating fluid through those channels 31a in case of this further embodiment is controlled via a valve being in signal connection with the controller 27.

In a further embodiment, the heat sink 20 may be divided into a heat-receiving plate 31b facing towards the rear surface 21 of the mirror substrate 21a and a cooling plate 31c arranged such that the heat receiving plate 31b is located in-between the rear surface 21a of the mirror substrate 18 and the cooling plate 31c. Such a design for the heat sink is described in US 2004/0051984 A1. The cooling plate 31c serves as a cooling part to remove heat from the heat receiving plate 31b. Arrangements, materials and surface processing of the heat receiving plate may be those described in US 2004/0051984 A1. The heat receiving plate may be arranged conformally to at least a portion of the rear surface 21a of the optical mirror 17.

In the embodiment of FIG. 2, the heating zones, i.e. the groups 25, 26, are arranged to give a heat receiving distribution of the mirror substrate 18 of dipole symmetry. Depending on the arrangement of resistance wire groups, it clearly can be seen that other heat receiving distributions of for example annular, quadrupole or multipole symmetry can be realized. The wires 23 or in general the heating device 22, 24 may be controlled individually regarding their electrical power. Further, the heating device 22, 24 may include Peltier elements. In that case, in addition to the control of the electrical power also the direction of an electrical direct-current or a direct-current component of the electrical power may be controlled for the individual heating device 22, 24 or for a group of them.

Due to the separation into individually controllable groups 25, 26 of resistance wires 23 or heating device, the heat transfer from the mirror substrate 18 to the reflective surface 19, shown by arrows 32, 33, varies with respect to different parts, i.e. in FIG. 2 a left part and a right part of the reflective surface 19.

The controller 27 controls the heating device 22 such that a total mirror heat load resulting from the heat 32, 33 received from the heating device 22 and heat 34 received from the illumination light source 2 via partial absorption of the illumination light bundle 3 in steady state is maintained constant. The heat 34, i.e. the power absorbed from the not reflected quantity of the illumination light bundle 3, is shown schematically in FIG. 2 as the arrow 34.

Via a line 35 the controller 27 is connected with a temperature sensor 36. The temperature sensor 36 is embedded in the mirror substrate 18 and measures the temperature of the mirror substrate 18. In the embodiment of FIG. 2, another temperature sensor is provided which is not shown. In general, the number of temperature sensors being provided at least equals the number of separately controllable groups of resistance wires. All of the temperature sensors provided are in signal connection with the controller 27 via lines or wireless. In general, the temperature sensor 36 is located in the vicinity of the reflecting surface 19 of the optical mirror 17.

As an alternative to a contact temperature sensor like the temperature sensor 36 or as an additional sensor, a non-contact temperature sensor 37 may be provided. An embodiment of such a non-contact temperature sensor 37 is shown in FIG. 2 and includes an imaging optics 38 making a thermal image of the reflecting surface 19 on a receiving thermal imaging array 39, e.g. a CCD array.

As indicated in FIG. 2, the controller 27 may be in signal connection with a control device 40 of the illumination system, in particular of the illumination light source 2 of the microlithography tool 1. This signal connection is schematically shown via a communication connection or a line 41. Further, via a communication connection or a line 42 the controller 27 may be in signal connection with a control device 43 for cooling device 43a of the heat sink 20. The controller 27 and the control devices 40, 43 may be part of an integrated control apparatus of the microlithography tool 1. The cooling device 43a may be a Peltier cooling device or a cooling device with controlled coolant flow. Examples for such cooling devices and for control of these cooling devices are given in US 2004/0035570 A1 the contents of which is incorporated herein by reference.

The temperature of the optical mirror 17, in particular of the reflecting surface 19, is maintained via the following method: At first, the optical mirror device 15 is heated via the heating device 22. The mirror device heating is controlled such that a total mirror device heat load resulting from the heat 32, 33 received from the heating device 22 and the heat 34 received from absorption of the illumination light bundle 3 impinging on the reflecting surface 19 is maintained constant in steady state. In the embodiment of FIG. 2, the temperature of the reflecting surface 19 is measured for example with the temperature sensor 36. As long as no illumination light bundle 3 impinges on the reflective surface 19, the temperature of the mirror substrate 18 underneath the reflecting surface 19 is relatively low, in particular below a first threshold. When the reflecting surface 19 is heated via absorption of the illumination light bundle 3, the temperature of the reflective surface 19 rises above this temperature threshold. Then, via the controller 27, heating of the mirror substrate 18 via the heating device 22 is reduced such that in general after a transient effect within a response time the sum of heat transfer 32 to 34 is maintained constant in steady state. In that case, a radiation heat transfer 44 from the optical mirror device 15 to the heat sink 20 is kept constant. Such a transient effect may be introduced via thermal absorption of energy from the illumination light bundle 3 impinging on the reflecting surface 19 as the microlithography tool starts to operate. In addition, such transient effects may be introduced via the controller 27 and the heating device 22 for control of a temperature gradient directed towards the surface area of the reflecting surface 19 of the mirror substrate 18. Such temperature gradient may be controlled via the controller 27 in absolute value and in direction.

Temperature control of the reflecting surface 19 results from heating control of the optical mirror device. During this temperature control, the temperature of the cold surface 21 of the heat sink 20 advantageously is kept constant in steady state, at least as long as the illumination of the reflecting surface 19 is done by one and the same operation mode of the illumination light source 2. In an alternative mode of operation to achieve temperature control of the reflecting surface 19, in addition the temperature of the cold surface 21 of the heat sink 20 may be varied. For example, heating via the heating device 22 or 24 may be accomplished with constant heating energy and temperature control of the reflecting surface 19 may be done via controlling the temperature of the cold surface 21. In practice, the temperature of the heat sink 20 always is lower than that of the mirror substrate 18. As long as the reflecting surface 19 is not heated via residual absorption of the illumination light bundle 3, the temperature of the reflecting surface 19 is somewhat lower than that of the rear surface 21a of the mirror substrate. When the main heat load results from residual absorption of the illumination light bundle 3, the reflecting surface 19 has a temperature which is higher than that of the rear surface 21a of the mirror substrate.

In an embodiment of the temperature controlling device 14 not shown in FIG. 2, temperature sensors may be omitted. The heating of the mirror device 15 then is controlled via checking the status of the illumination system, in particular of the illumination light source 2, via the control device 40. For example, when the power of the illumination light source 2 is increased, the controller 27 receives a respective information from the control device 40 and, in response thereto, reduces the heating via the heating device 22 respectively. Such control may be realized via establishing a look-up table or via a model-based or feedforward-control.

Figure 3:
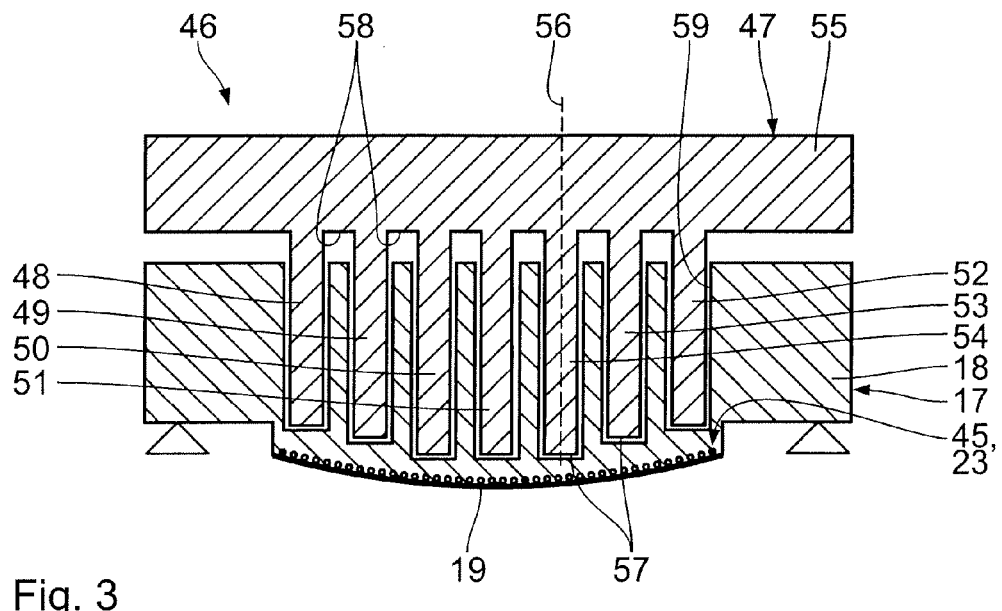
FIG. 3 shows schematically another embodiment of a heat sink of a device for controlling temperature of an optical mirror device.

FIG. 3 shows another embodiment of a heat sink and an optical mirror of a temperature controlling device. Components corresponding to that which have been already discussed with respect of FIGS. 1 and 2 are designated with the same reference numbers and are not described in detail below.

In the embodiment of FIG. 3, the optical mirror 17 is shown as a convex mirror. Heating device 45 of the temperature controlling device 46 of FIG. 3 are resistance wires 23 which are embedded directly underneath an optical coating of the reflecting surface 19.

Due to this arrangement of the heating device 45, the heat produced via the heating device 45 is generated in the same mirror area where also residual absorption of the illumination light bundle 3 takes place. This facilitates equalization of the sum of the heat loads 32, 33 and 34 in steady state.

A heat sink 47 of the temperature controlling device 46 is structured such that thermal radiation transfer from the mirror substrate 18 to the heat sink 47 varies with respect to different parts of the reflecting surface 19. To this end, the heat sink 47 includes seven heat sink fingers 48, 49, 50, 51, 52, 53, 54, numbered in FIG. 3 from left to right. These heat sink fingers 48 to 54 are parallel to each other and are connected via a heat sink main body 55. Neighboring heat sink fingers 48 to 54 are equally spaced apart. All heat sink fingers 48 to 54 point towards the reflecting surface 19. Perpendicular to a longitudinal axis 56, the heat sink fingers 48 to 54 may have a circular cross-section, i.e. the heat sink fingers 48 to 54 may have a cylindrical shape with the longitudinal axis 56 as axis of rotational symmetry. Alternatively, the cross-sections of the heat sink fingers 48 to 54 may be quadratical or rectangular or for example hexagonal. In a plane perpendicular to the axis 56, the heat sink fingers 48 to 54 are arranged in a hexagonal field structure, i.e. as an array with hexagonal symmetry. Alternatively, the heat sink fingers 48 to 54 may be arranged in a rectangular matrix array structure or may be arranged in at least one row. The symmetry of the arrangement of the heat sink fingers 48 to 54 is adapted to the symmetry of the heat receiving distribution of the heating zones of the heating device 55 and/or is adapted to the symmetry of the heat receiving distribution which the reflecting surface 19 receives via absorption of the illumination light bundle 3.

Tips 57 of the heat sink fingers 48 to 54 constitute a first section of the heat sink 47 having a first, minor distance to the reflecting surface 19. Gaps 58 between the heat sink fingers 48 to 54 constitute a second section of the heat sink 47 having a second, major distance to the reflecting surface 19.

The heat sink fingers 48 to 54 have a different length. The length of the heat sink fingers 48 to 54 follows the curvature of the reflecting surface 19. In case of the convex reflecting surface 19 of FIG. 3, the middle heat sink finger 51 and its neighbors 50 and 52 are the longest fingers. The heat sink fingers 49 and 53 are shorter than the heat sink fingers 50 to 52 but longer than the outer heat sink fingers 48 and 54.

The heat sink fingers 48 to 54 are received in recesses 59 of the mirror substrate 18.

Figure 4:
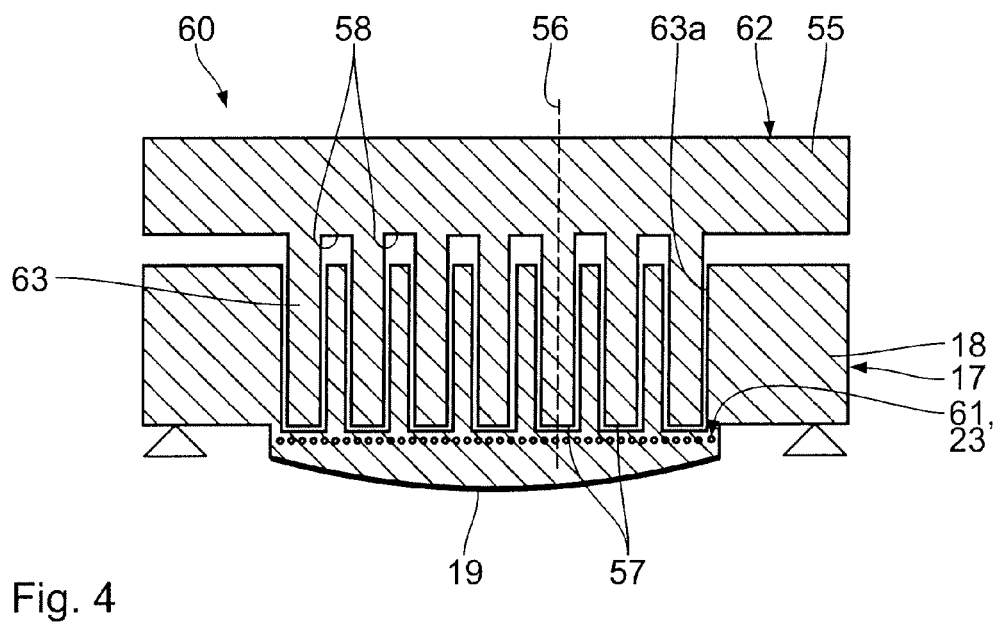
FIG. 4 shows schematically another embodiment of a heat sink of a device for controlling temperature of an optical mirror device.

FIG. 4 shows another embodiment of a temperature maintenance device 60 with a heat sink and an optical mirror device. Components corresponding to that which have been already discussed with respect to FIGS. 1 to 3 are designated with the same reference numbers and are not described in detail below.

Heating device 61 are provided as resistance wires 23 which are embedded in a plane in the mirror substrate 18. In FIG. 4, the reflecting surface 19 is a convex surface. As the heating wires 23 are located in a plane, they do not follow the curvature of the reflecting surface 19 in contrast to the embodiment of FIG. 3.

A heat sink 62 of the temperature controlling device 60 resembles the heat sink 47 of the temperature maintenance device 46. In contrast to the temperature controlling device 46 of FIG. 3, heat sink fingers 63 are all of the same length. The tips 57 of the heat sink fingers 63 are equally spaced apart from the plane where the resistance wires 23 of the heating device 61 are embedded. The heat sink fingers 63 are received in recesses 63a of the mirror substrate 18.

Figure 5:
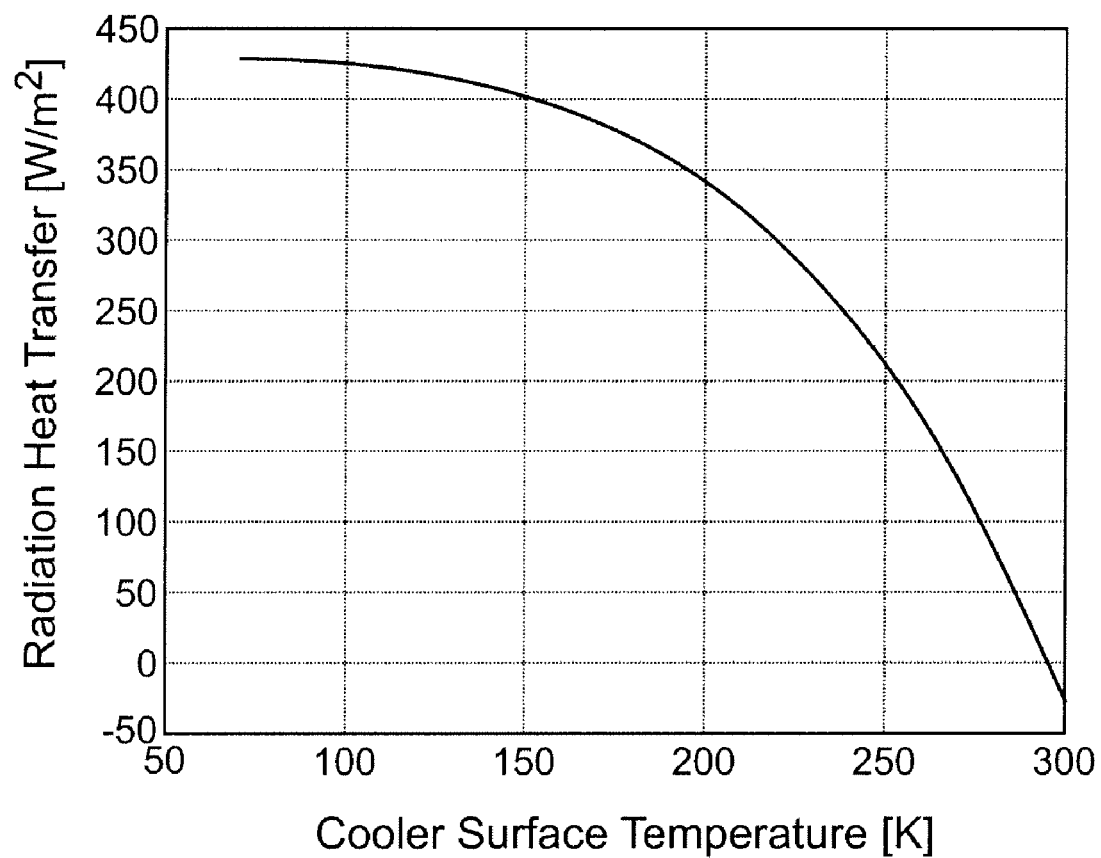
FIG. 5 is a diagram showing radiation heat transfer from a mirror heat transfer area to a heat sink as a function of the temperature of the heat sink.

FIG. 5 shows the net radiation heat exchange over a small gap between a mirror heat transfer area, e.g. between the mirror substrate 18, and the cold surface 21 of the heat sink 20 or 47 or 62. This net radiation heat exchange is shown as a function of the cold surface temperature. The cold surface temperature is given in units [K]. The net radiation heat exchange or transfer is given in units [W/m2]. Assuming a maximum heat load of the reflecting surface 19 of the optical mirror 17 of 4 W and a heat transfer area on the mirror, in case of the embodiments of FIGS. 2 to 4 on the mirror back side, of 0.02 m2 and a reference temperature of the mirror substrate 18 of 295 K, it can be seen from FIG. 5 that a surface temperature of the cold surface 21 of about 250K is involved to generate a sufficient cooling power bias. Cooling of the cold surface 21 via the cooling device 43 may take place by thermal electric cooling (TEC), by expansion methods, i.e. refrigerator principle, or by cooling by cold gases or liquids like for example liquid nitrogen.

Figure 6:
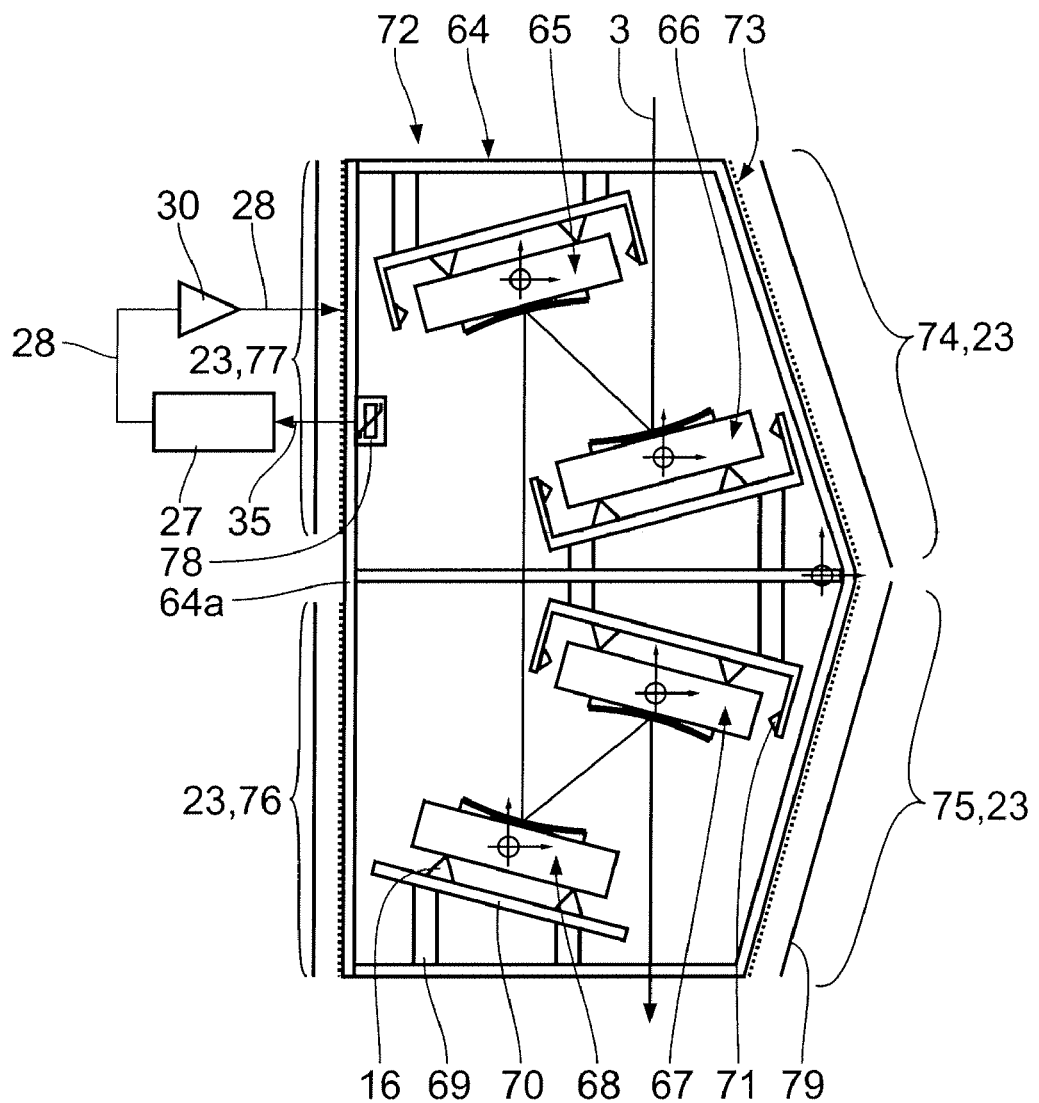
FIG. 6 shows schematically a part of the illumination optics of the illumination system including a mirror holding structure being a heat receiving structure of another embodiment of a device for controlling temperature of an optical mirror device.

FIG. 6 shows a part of the illumination optics 4 or of the projection optics 8 of the microlithography tool 1 of FIG. 1. Components corresponding to that which have been already discussed are designated with the same reference numbers and are not described in detail below. This part of the optics of the microlithographic tool 1 includes a mirror holding structure 64. This holding structure 64 is realized as a mechanical structure and/or as a metrology frame. The holding structure 64 is a cellular structure having a mesh of carrier bars 64a which are arranged trapezoidal. Four optical mirrors 65 to 68 are carried by the holding structure 64 via posts 69 and carrying plates 70. The mirrors 65 to 68 are numbered in FIG. 6 from above to below. The mirrors 65, 66 are arranged in a first cell of the holding structure 64 and the mirrors 67, 68 are arranged in a second cell of the holding structure 64. The mirrors 65 to 68 have a typical diameter of 100 mm.

The holding points 16, where the backsides of the mirror substrates 18 come into contact with the carrier plates 70 are designed as mirror position actuators so that tuning of the illumination light bundle forming and guiding function of the illumination and/or projection optics shown in FIG. 6 is possible.

Three of the mirrors 65 to 67 are active mirrors whose position is controlled via mirror position sensors 71 which are carried by the carrier plate 70. The mirror 68 is a passive mirror having no position sensor.

A temperature controlling device 72 uses the mirror holding structure 64 as heat receiving structure. The mirror holding structure 64 is heated by heating device 73 with groups 74 to 77 of resistance wires 23. The groups 74 to 77 are in contact with the outer surfaces of the carrier bars 64a of the holding structure.

The number of groups 74 to 77 of resistance wires 23 of the heating device 73 equals the number of mirrors 65 to 68. This ensures individual heating of the mirrors 65 to 68 via the groups 74 to 77.

Temperature sensors 78 are in contact with those carrier bars 64a which are in contact with the resistance wires 23.

In FIG. 6, only one of the temperature sensors 78, namely that being in contact with the carrier bar 64a belonging to the group 77 of resistance wires 23 is shown. Each of the other groups 74 to 76 has its own temperature sensor 78.

The temperature controlling device 72 has heat sinks 79, each being arranged in the vicinity of those carrier bars 64a being equipped with the groups 74 to 77 of heating resistance wires 23. Each heat sink 79 is spaced apart from its respective carrier bar 64a by a gap such that each heat sink 79 is not in mechanical contact with the carrier bar 64a. The heat sinks 79 are located outside the cells of the cellular holding structure 64.

In the case of the embodiment of FIG. 6, the controller 27 controls the heating device 73 such that a total heat load on the mirror holding structure 64, the posts 69 and the carrying plates 70 and, as a further effect, a total heat load on each of the optical mirrors 65 to 68 resulting from the heat received from the groups 74 to 77 of the heating device 73 on the one hand and the heat received via residual absorption of the illumination light bundle 3 by the reflecting surfaces 19 on the other is maintained constant in steady state. Groups 74 to 77 are connected to the controller 27 in the same way as the group 77. This is not shown in FIG. 6. This temperature control works according to the principles outlined above with respect to the embodiment of FIG. 2.

When the illumination light source 2 is shut off, the reflecting surfaces 19 of the mirrors 65 to 68 receive heat only via the heating device 73. When an illumination light bundle 3 is reflected via the reflecting surfaces 19 of the mirrors 65 to 68, heat is absorbed by those reflecting surfaces 19. The heating device 73 are then controlled such that the heat transfer from the groups 74 to 77 with respect to the reflecting surfaces 19 of the mirrors 65 to 68 is lowered with the result that the total mirror heat load is kept constant in steady state.

Instead of four groups 74 to 77, a higher number of groups of resistance wires 23 of the heating device 73 may be provided. This gives the possibility of generating different heating zones for one and the same reflecting surface 19 which in turn gives the possibility to heat the reflecting surfaces 19 with a heat distribution e.g. of annular, quadrupole or dipole symmetry.

In the production of a microstructured component using the microlithography tool 1, at first the reticle 6 and the wafer 12 are provided on the reticle stage 7 and the wafer stage 13. Then, the reticle structure is projected as an illumination microstructure onto a wafer layer which is sensitive for the illumination light of the microlithography tool 1. Then, the microstructured component is generated from the illumination microstructure via development of the wafer layer.

Figure 7:
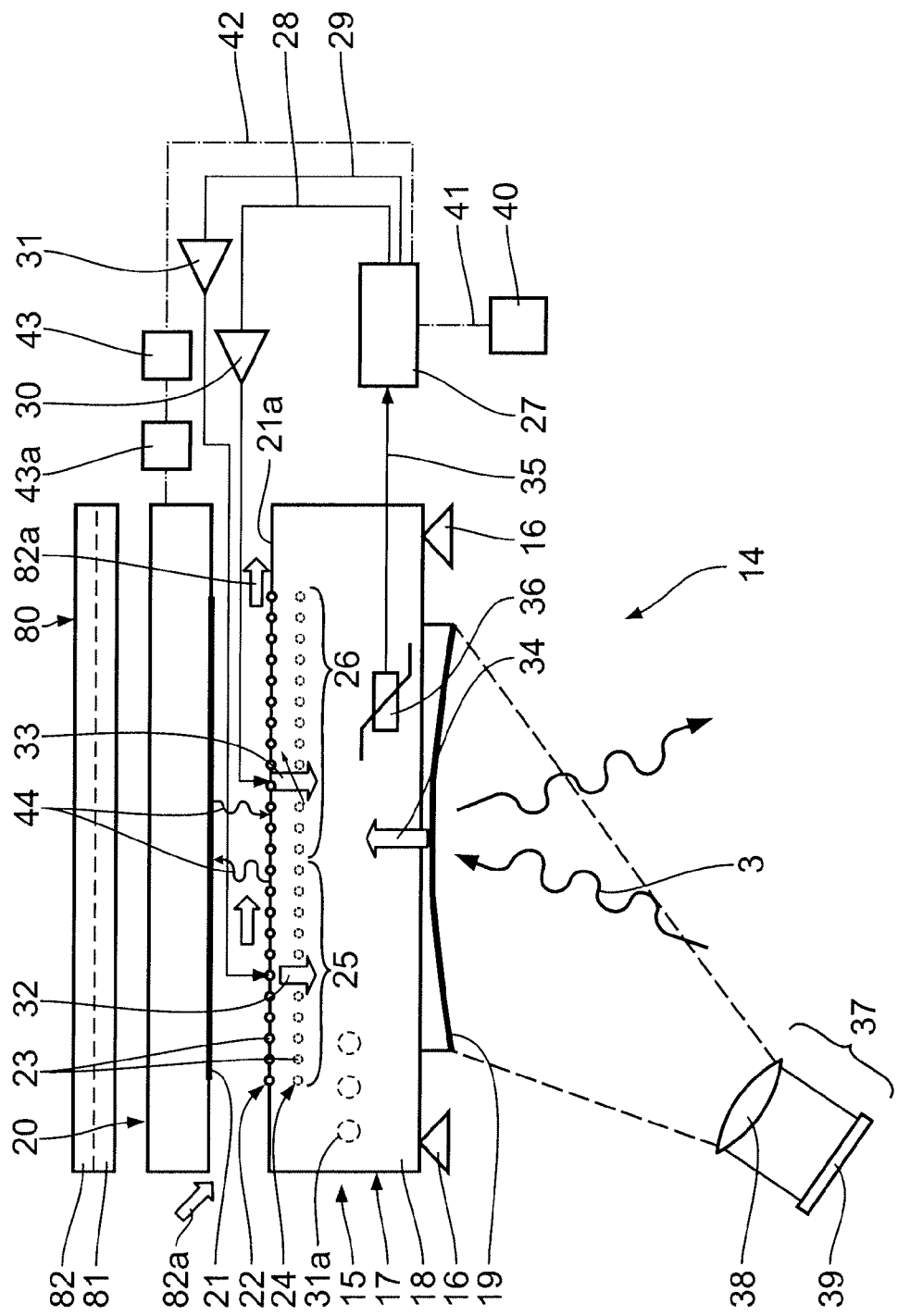
FIG. 7 shows in a manner similar to FIG. 2 an optical mirror device having in addition a radiation shielding.

FIG. 7 shows another embodiment of a device 14 for controlling temperature of an optical mirror device which can be part of an illumination optics of an illumination system of the microlithography tool of FIG. 1. Components corresponding to those which have been already discussed with respect to FIGS. 1 to 6 are designed with the same reference numbers and are not described in detail below.

The device 14 for controlling temperature of the optical mirror device shown in FIG. 7 in addition has a radiation shielding 80 including a heating device 81 and a further heat sink 82. The radiation shielding 80 serves to reduce a possible thermal influence of the device 14 for controlling temperature on the wafer 12, on the reticle 6 or on another heat-sensitive component of the microlithography tool 1. An example for such a radiation shielding or heat-proofing device is described with reference to FIGS. 3 and 7 in US 2004/0051984 A1.

For thermalization of a gap between the heat sink 20 and the mirror substrate 18, gas may be supplied to this gap and after passage through this gap may be evacuated via a suction device. The flow of such a gas in FIG. 7 is indicated by arrows 82a. Such a gas supply is described in US 2004/0051984 A1 e.g. with respect to FIG. 11.

Figure 8:
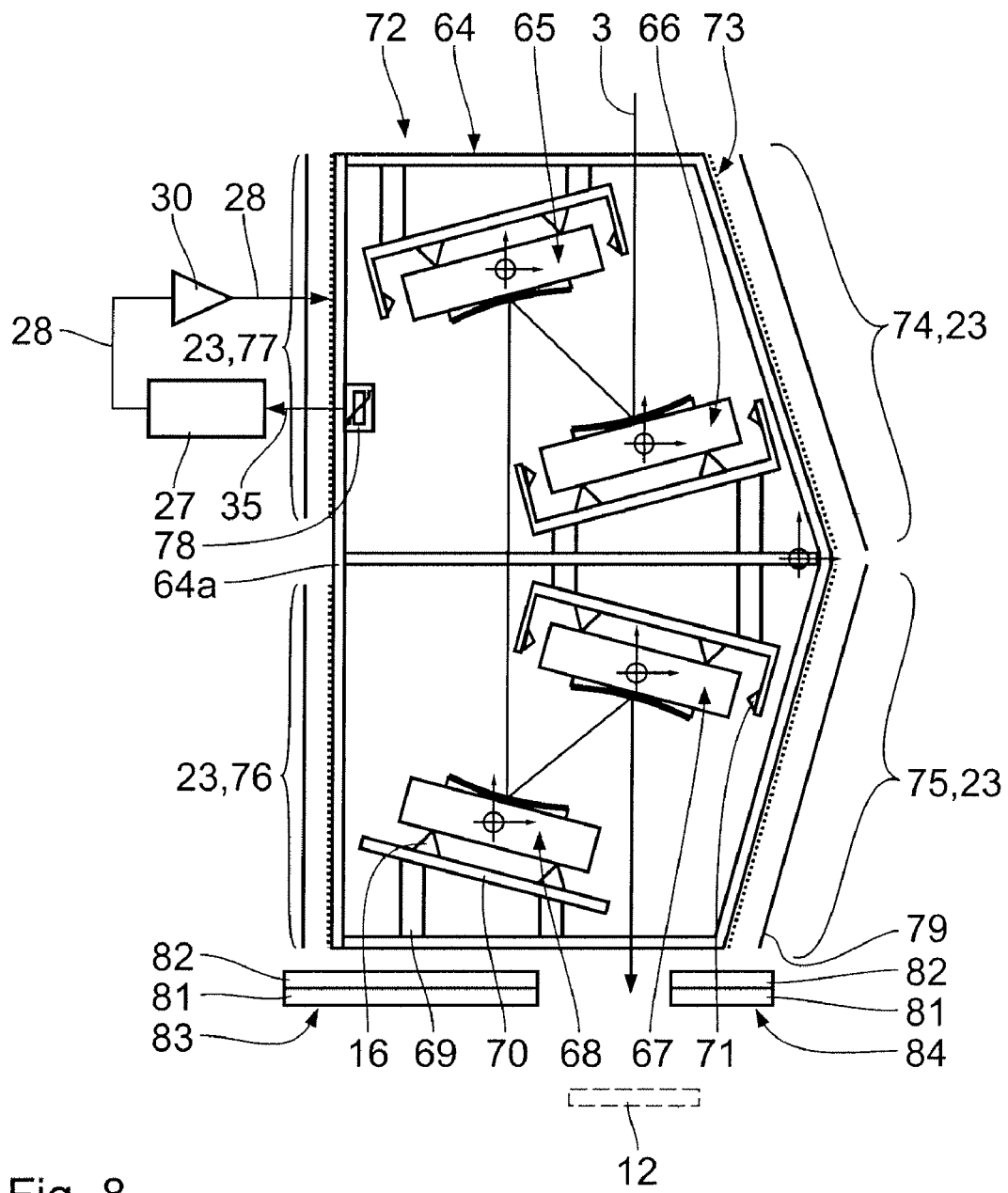
FIG. 8 shows in a manner similar to FIG. 6 a part of the illumination optics of the illumination system with an additional radiation shielding.

FIG. 8 shows another embodiment of a part of the illumination optics 4 of the microlithography tool 1 of FIG. 1. Components corresponding to those which have been already discussed with respect to FIGS. 1 to 7 are designated with the same reference numbers and are not described in detail below.

FIG. 8 shows radiation shieldings 83 and 84 between the temperature controlled holding structure 64 and the wafer 12 which is schematically depicted with broken lines. The radiation shielding 83 is located between the groups 76, 77 of resistance wires 23 and the wafer 12. The radiation shielding 84 is located between the groups 74 and 75 of resistance wires 23 and the wafer 12. The radiation shieldings 83, 84 serve to reduce the thermal influence of the thermalization of the holding structure 64 on the wafer 12. The radiation shieldings 83, 84 each include a further heating device 81 and a further heat sink 82 as described above with reference to FIG. 7.

Figure 9:
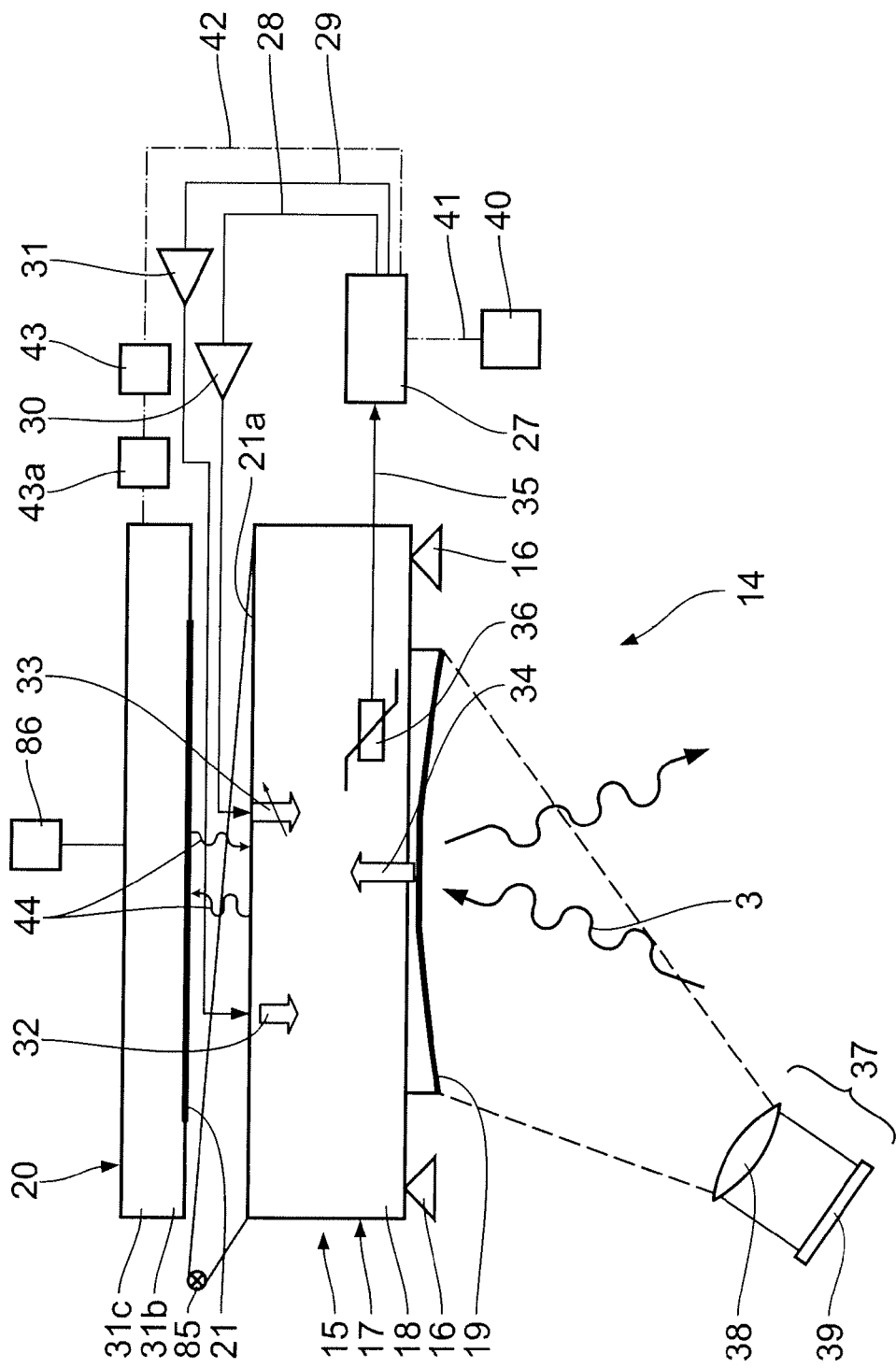
FIG. 9 shows in a manner similar to FIG. 2 an optical mirror device having a further embodiment of a device for controlling temperature.

FIG. 9 shows another embodiment of a device 14 for controlling temperature of an optical mirror device. Components corresponding to those which have been already discussed with respect to FIGS. 1 to 8 are designated with the same reference numbers and are not described in detail below. Instead of a heating device including groups of resistance wires or heating fluid channels, the embodiment of FIG. 9 has an infrared radiation source 85 for heating the rear surface 21a of the mirror substrate 18.

Further, in the embodiment of FIG. 9, the heat sink 20 is connected to an actuator 86 being able to move the heat sink 20 relative to the mirror substrate 18 in order to adjust the gap between the heat sink 20 and the mirror substrate 18 and to produce fine positioning of the heat sink 20 relative to the mirror substrate 18 with respect to a gap width and/or a tilt angle and further with respect to an overlap of the heat sink 20 and the mirror substrate 18. Actuator 86 is in signal connection with the controller 27 via a signal line which is not depicted in FIG. 9.

If, e.g. via thermal sensing with the help of a plurality of temperature sensors 36, certain e.g. non-symmetric temperature patterns within the mirror substrate 18 arise, such a non-symmetric pattern may be eliminated via respective movement of the heat sink 20 relative to the mirror substrate 18 via controlled movement of the actuator 86 via the controller 27. For detection of the relative positions of the heat sink 20 to the mirror substrate 18, a position sensor may be present which is not depicted in FIG. 9. Via a signal line this position sensor is connected to the controller 27.

FIG. 10 shows another embodiment of a device 14 for controlling temperature of an optical mirror device. Components corresponding to those which have been already discussed with respect to FIGS. 1 to 9 are designated with the same reference numbers and are not described in detail below.

In the embodiment of FIG. 10 cooling of the cold surface 21 of the heat sink 20 is realized via cooling channels 87 being arranged in a body of the heat sink 20. Cross-sections of these channels 87 are indicated in FIG. 10 as broken lines. In a plane being parallel to the cold surface 21 and being arranged in the body of the heat sink 20, the cooling channels 87 are equally distributed.

FIG. 11 shows a representative cross-section of the cooling channel 87. A conduit 88 is arranged inside the channel 87 and is configured to distribute a cooling fluid 89 through the channel 87. Between the conduit 88 and an inner wall 90 of the channel 87 a gap 91 is formed. This gap 91 is filled with a heat conducting gas. The gap 91 is configured to be maintained at a pressure sufficiently low to prevent or to substantially prevent distortion of a surface figure of the cold surface 21 of the heat sink 20. Details of a cooling means having such cooling channels with inner conduits spaced apart from the inner channel walls by a gap are described in EP 1 376 185 A2, the contents of which is incorporated by reference.

In a further embodiment, the channels 87 may be arranged in a plane of the cooling plate 31c according to the respective embodiment described above with reference to FIG. 2.

In a further embodiment, heating of the mirror body 18 may be accomplished via heating channels 92 having a similar arrangement to the one of the cooling channels 87 described above. Such heating channels 92 are shown in FIG. 10 as cross-sections within the mirror body 18 in broken lines and in more detail in FIG. 12. Inside the heating channels 92 a conduit 93 is arranged to distribute a heating fluid 94 through the heating channel 92. Between an inner wall 95 of the heating channel 92 and the conduit 93 a gap 96 is formed being filled with a heat conducting gas. The heat conductive gas in the gap 96 is maintained at a pressure sufficiently low to substantially prevent distortion of the reflective surface 19 of the mirror 17.

Vibrations induced by the flow of the fluid through the conduits 88, 93 are not transferred to the inner walls 90, 95 of the channels 87, 92.

The thermalization fluids 89, 94 and the heat conductive gas in the gaps 91, 96 are provided via sources which are not shown and which are controlled via the controller 27. In the embodiment of FIG. 10 using the heating channels 92, heating via resistance wires 23 may be omitted.

Within the gaps 91, 96 spacers 97 may be arranged to maintain a given width of the gaps 91, 96 around the periphery of the conduits 88, 93.

Throughout all the embodiments of FIGS. 1 to 10, combined thermalization of the optical mirror 17 via absorption of the illumination light bundle 3, i.e. the working radiation, via heating of a heating part, e.g. heating via the resistance wires 23 or via the heating channels 92, and cooling via a radiation cooling part, i.e. via the cold surface 21 of the heat sink 20, is controlled via the controller 27 such that this combined thermalization leads to temperature stabilization of the optical element.

To achieve an adequate temperature control, the heat sink 20 may be equipped with a temperature sensor 97a or with a plurality of such temperature sensors 97a being distributed within the body of the heat sink 20 and being in signal connection with the controller 27.

FIG. 10 shows in addition an optional radiation shielding 98 surrounding all surfaces of the heat sink 20 besides the cold surface 21 thus preventing the heat sink 20 from absorbing heat from a member other than the optical mirror 17.

To block transmission of vibration and positional changes, components of the device for controlling temperature may be connected via spring members. Examples for this are given with respect to FIGS. 8, 12 and 13 in US 2004/0051984 A1.

The optical system of the microlithography tool including the device 14 for controlling temperature has an overall wave-front error which is less or equal to 0.5 nm.

The several embodiments for the device 14 for controlling temperature allow a thermally induced surface figure correction in a wave-front range up to 2 nm. Temperature profile shapes over the thermally controlled optical surfaces according to the symmetries in particular of the Zernike polynoms Z6 to Z16 may be introduced via these embodiments of the device 14 for controlling temperature. Accordingly, these devices 14 for controlling temperature address wave-front errors in the symmetry range of the Zernike polynoms Z5 and higher. The Zernike polynoms, for example in the fringe notation are known from mathematical and from optical literature.

These devices 14 allow compliance of the surface figures with a profile resolution (wave-front) of 0.2 nm rms, an accuracy (wave-front) of 0.1 nm and a maximal drift (wave-front) of 0.1 nm per 20 minutes.

The devices 14 for controlling temperature described above allow for a typical temperatures control a setting time of 10 s.

All embodiments of the device 14 for controlling temperature comply with ultra-high vacuum (UHV) conditions.

What is claimed is:

1. A system, comprising:
a cooling device comprising a radiational cooling element disposed away from an optical element, the radiational cooling element being configured to cool the optical element by radiation heat transfer;
a heating device configured to heat the optical element; and
a controller configured to control a temperature of the radiational cooling element and to control a temperature of the heating device,
wherein the device is configured to control a temperature of the optical element when the optical element is in a vacuum atmosphere.

2. The system according to claim 1, further comprising a light source configured so that light emitted from the light source impinges on the optical element, the controller being configured to control the light source, wherein the controller is configured to stabilize the temperature of the optical element by controlling light from the light source that impinges on the optical element, heating of the optical element by the heating device, and cooling of the optical element by the radiational cooling element.

3. The system according to claim 2, wherein the controller is configured to place the optical element at a steady state temperature that is independent an amount of light emitted by the light source that impinges on the optical element.

4. The system according to claim 1, further comprising a temperature sensor configured to detect the temperature of the optical element, wherein the temperature sensor is in communication with the controller so that, based on the temperature of the optical element sensed by the temperature sensor, the controller controls the heating device and/or the radiational cooling element so that the temperature of the optical element sensed by the temperature sensor attains a predetermined value.

5. The system according to claim 1, wherein the cooling device includes an input into which cooling fluid can flow during use, and the controller is in communication with the input of the cooling device.

6. The system according to claim 1, wherein the heating device includes an input into which heating fluid can flow during use, and the controller is in communication with the input of the heating device.

7. The system according to claim 1, further comprising a radiation shielding configured to prevent the radiational cooling element from absorbing heat from a component of the system other than the optical element.

8. The system according to claim 1, further comprising a radiation shielding configured to prevent components of the system neighboring the optical element from absorbing heat from the heating device.

9. The system according to claim 1, wherein the radiational cooling element comprises a cooling plate of a Peltier element.

10. The system according to claim 1, wherein the radiational cooling element comprises a heat-receiving plate arranged proximally to the optical element along a surface of the optical element at which light directed to the optical element is not incident or outgoing, the heat-receiving plate being configured to receive heat from the optical element.

11. The system according to claim 1, wherein the cooling device further comprises a heat sink configured to receive thermal radiation from the optical element, the cooling device including a channel and a conduit inside the channel to distribute a cooling fluid through the channel, a gap being between the conduit and the channel, the gap being configured to be maintained at a pressure sufficiently low to substantially prevent distortion of the heat sink.

12. The system according to claim 1, wherein the radiational cooling element comprises at least two heat sink fingers pointing towards the optical element.

13. The system according to claim 1, wherein:
the optical element comprises a mirror element that comprises a mirror that includes a mirror body and a reflective surface on the mirror body;
the heating device includes a channel and a conduit inside the channel;
the channel is formed in a first surface of the mirror body;
the conduit is configured to distribute a heating fluid through the channel;
a gap between the conduit and the channel is configured to be maintained at a pressure sufficiently low to substantially prevent distortion of the reflective surface or of the mirror body; and
a second surface of the mirror body is in thermal communication with the radiational cooling element.

14. The system according to claim 13, wherein the second surface of the mirror body is adjacent to the reflective surface of the mirror.

15. The system according to claim 11, wherein a spacer is arranged between the conduit and an inner wall of the channel to prevent the conduit from contacting the inner wall of the channel.

16. A method, comprising:
sensing a temperature of an optical element in a vacuum atmosphere;
based on the sensed the temperature of the optical element, cooling the optical element via a radiational cooling element; and
based on the sensed the temperature of the optical element, heating the optical element via a heating device.

17. The method according to claim 16, further comprising:
emitting light from a light source so that the light impinges on the optical element; and
stabilizing the temperature of the optical element by controlling light from the light source that impinges on the optical element, heating of the optical element by the heating device, and cooling of the optical element by the radiational cooling element.

18. An optical system, comprising:
a plurality of optical elements including a first optical element;
a radiational cooling element disposed away from the first optical element, the radiational cooling element being configured to cool the first optical element by radiation heat transfer;
a heating device configured to heat the first optical element; and
a controller configured to control a temperature of the radiational cooling element and to control a temperature of the heating device,
wherein the system is a microlithography optical system, and the first optical element is in a vacuum atmosphere.

19. The system according to claim 18, further comprising a light source, wherein the system comprises illumination optics and projection optics.

20. The system according to claim 19, wherein the light source is an EUV source.

* * * * *

UNITED STATES PATENT AND TRADEMARK OFFICE
CERTIFICATE OF CORRECTION

Page 1 of 1

PATENT NO.        : 8,057,053 B2
APPLICATION NO.   : 12/755193
DATED             : November 15, 2011
INVENTOR(S)       : Markus Hauf It is certified that error appears in the above-identified patent and that said Letters Patent is hereby corrected as shown below:

Column 2, Line 15-44, delete "The device for. . .of the optical element." insert the same as new paragraph at Line 16.

Signed and Sealed this
Thirty-first Day of January, 2012

David J. Kappos
*Director of the United States Patent and Trademark Office*